United States Patent [19]

Yamamoto et al.

[11] 4,252,595
[45] * Feb. 24, 1981

[54] ETCHING APPARATUS USING A PLASMA

[75] Inventors: Shinichi Yamamoto; Yasusuke Sumitomo, both of Yokohama; Yasuhiro Horiike, Tokyo; Masahiro Shibagaki, Hiratsuka, all of Japan

[73] Assignee: Tokyo Shibaura Electric Co., Ltd., Japan

[*] Notice: The portion of the term of this patent subsequent to Jun. 13, 1995, has been disclaimed.

[21] Appl. No.: 891,152

[22] Filed: Mar. 28, 1978

Related U.S. Application Data

[63] Continuation-in-part of Ser. No. 762,386, Jan. 26, 1977, Pat. No. 4,094,722, and Ser. No. 862,161, Dec. 19, 1977.

[30] Foreign Application Priority Data

Jan. 29, 1976 [JP] Japan .................................. 51-7957
Dec. 22, 1976 [JP] Japan ............................. 51-153314

[51] Int. Cl.³ .............................................. C23F 1/02
[52] U.S. Cl. .................................... 156/345; 156/643; 156/646; 204/192 E; 204/298; 250/531
[58] Field of Search ...................... 156/345, 643, 646; 204/192 R, 192 E, 298, 157.1, 164; 118/49.1, 50.1, 49.5, 722, 723; 250/531, 542

[56] References Cited

U.S. PATENT DOCUMENTS

| | | | |
|---|---|---|---|
| 3,437,864 | 4/1969 | Kofoid et al. | 204/192 R |
| 3,654,108 | 4/1972 | Smith | 204/164 |
| 3,827,966 | 8/1974 | Needham | 204/192 R |
| 3,875,068 | 4/1975 | Mitzel | 204/164 |
| 3,904,506 | 9/1975 | Carmichael et al. | 204/192 R |
| 3,906,892 | 9/1975 | Cakenberghe | 118/49.1 |
| 3,933,644 | 1/1976 | Skinner | 204/192 |
| 4,006,070 | 2/1977 | King et al. | 204/298 |
| 4,075,972 | 2/1978 | Yamawaki et al. | 118/49.1 |
| 4,094,722 | 6/1978 | Yamamoto et al. | 156/345 |
| 4,123,316 | 10/1978 | Tsuchimoto | 153/345 |
| 4,138,306 | 2/1979 | Niwa | 156/643 |
| 4,149,923 | 4/1979 | Uehura et al. | 156/643 |
| 4,151,034 | 4/1979 | Yamamoto et al. | 156/643 |
| 4,160,690 | 7/1979 | Shibagaki et al. | 156/643 |

Primary Examiner—Jerome W. Massie
Attorney, Agent, or Firm—Finnegan, Henderson, Farabow, Garrett & Dunner

[57] ABSTRACT

An etching device uses a gas activated by a plasma for etching semiconductor elements. The apparatus includes etching chamber in which semiconductor elements are horizontally held by a supporting plate or conveyer and etched. The etching gas introduced from the upper side of the semiconductor element to the down side thereof through holes formed in the supporting plate or conveyer.

6 Claims, 8 Drawing Figures

ETCHING APPARATUS USING A PLASMA

CROSS-REFERENCE TO RELATED APPLICATION

This is a continuation-in-part application of U.S. Pat. application Ser. No. 762,386 filed on Jan. 26, 1977, now U.S. Pat. No. 4,094,722, and U.S. patent application Ser. No. 862,161 filed on Dec. 19, 1977.

This invention relates to an etching apparatus and more particularly to an etching apparatus using a plasma.

Recently, a plasma-type etching process using, for example, tetrafluoromethane ($CF_4$) gas, commercially known as Freon gas has come to be more widely accepted in place of solution-type etching. This plasma-type etching process is applied in extremely fine working not only on a polycrystalline silicon layer, silicon nitride layer, and silicon oxide layer but also on a molybdenum layer and tungsten layer. The conventional plasma-type etching process indeed has the advantages of suppressing the occurrence of environmental pollution due to application of harmful chemicals such as hydrofluoric acid as in the case with solution type etching and eliminating the necessity of forming a silicon oxide layer between a photoresist and silicon nitride layer, when the latter is etched, thereby reducing a required number of operation steps. But the prior art plasma-type etching process has the drawbacks that an object of etching, for example, a semiconductor element placed in a plasma tends to be unnecessarily damaged; an uneven distribution of positive and negative fluorine ions in a high electric and magnetic field leads to irregular etching; where an operator watches etching condition, ultraviolet rays emitted during the plasma etching adversely affect his eyes; and it is impossible to carry out the continuous process of etching a plurality of objects successively brought into a plasma and taking out fully etched objects one after another, resulting in very inefficient etching.

It is accordingly an object of this invention to provide an etching apparatus which has the merits of the known plasma-type etching process and yet is free from the difficulties encountered in the past. An etching apparatus embodying this invention has been accomplished from the fact that a suitable gas, for example, tetrafluoromethane activated by charged particles retains an etching action during a certain length of time after drawn off from high electric and magnetic fields.

This invention can be more fully understood from the following detailed description when taken in conjunction with the accompanying drawings, in which.

Figure 1:
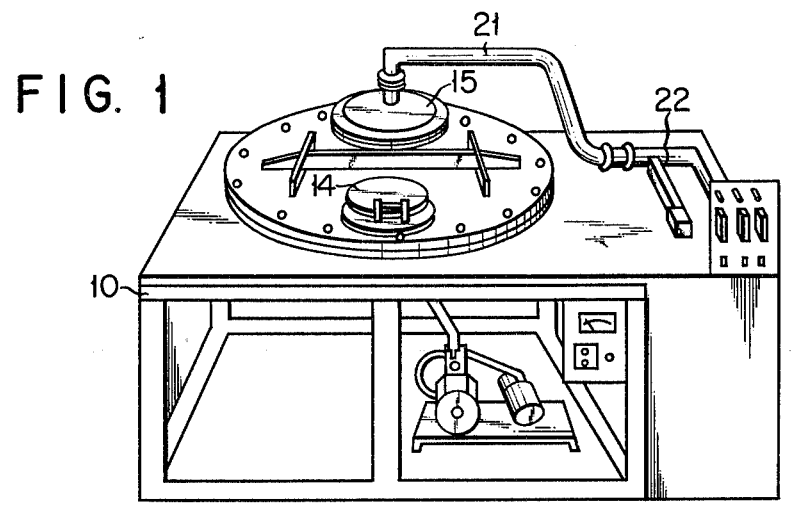
FIG. 1 is an oblique view of an entire etching apparatus embodying this invention.
Figures 2, 3:
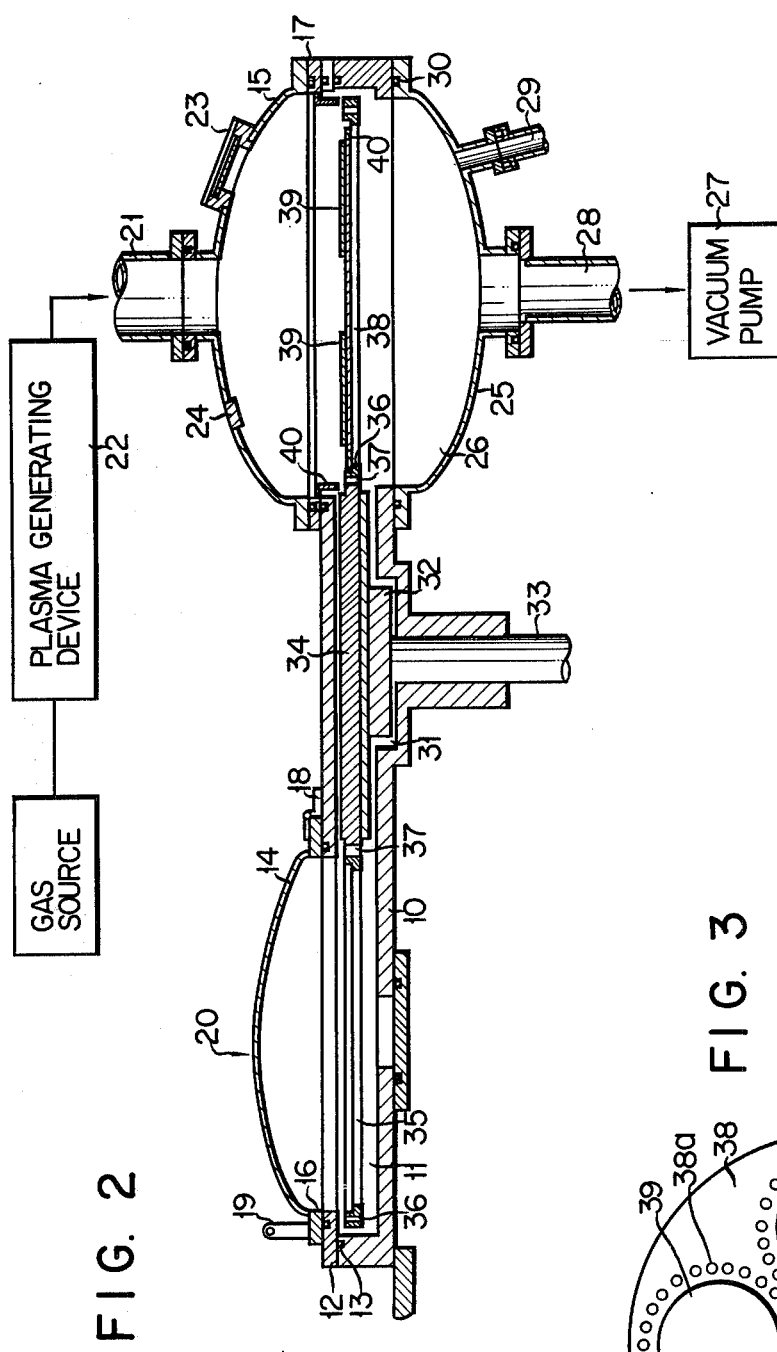
FIG. 2 is a fractional sectional view of FIG. 1.
FIG. 3 is a plan view of a palette received in the plasma generator of FIG. 2.

There will now be described by reference to FIGS. 1 to 3 a continuous etching apparatus using a plasma embodying this invention.

A large circular depression 11 is formed in the upper surface of a support table 10. A disk-like cover 12 is mounted on the upper surface of the support table 10 with an O-ring 13 interposed therebetween to seal the depression 11 in airtightness, providing a hollow flat chamber. The cover 12 has a pair of symmetric circular openings bored on the right and left sides respectively of the central axis of said cover 12. A hatch 14 is hermetically fitted to one opening with an O-ring 16 interposed therebetween. A hatch 15 is similarly fitted to the other opening with an O-ring 17 interposed therebetween. One hatch 14 has one end fitted to the cover 12 by means of a hinge 18. If necessary, a handle 19 is grasped by the hand to swing said hatch 14 thereby to open the opening. The hatch 14, hinge 18, handle 19 and said one opening collectively constitute a feeding section 20 for an object of etching. One end of a gas feeder 21 is open to the central portion of the upper wall of the other hatch 15. The gas feeder 21 is connected as shown in FIG. 1, to a plasma generator or plasma generating device 22. High-frequency waves such as microwaves are impressed across a pair of parallel plate electrodes received in the plasma generator 22 to convert, for example, tetrafluoromethane ($CF_4$) gas and oxygen gas mixed in a substantially equal proportion into the form of plasma. The plasma generator 22 used with the etching apparatus of this invention may consist of any type well known to this particular field.

The upper wall of said other hatch 15 is provided with a peep window 23 for observing the interior of the hatch section and a photosensor 24 formed of a light-receiving element prepared from, for example, cadmium selenide (CdSe) for detecting the condition in which etching of an object is proceeding. The opposite side of the support table 10 to that on which the hatch 15 is provided is hermetically fitted with another hatch 25 with an O-ring 30 interposed therebetween. Both hatches 15, 25 define an etching chamber 26. That portion of the lower hatch 25 which is disposed symmetric with the gas feeder 21 of the upper hatch 15 with respect to the horizontal axis of the etching chamber 26 communicates with one end of a gas discharge pipe 28 of a vacuum pump 27. When the subject etching apparatus is operated, a mixture of, for example, tetrafluoromethane gas and oxygen gas brought into the etching chamber 26 through the gas feeder 21 flows almost straight downward to be drawn off through the gas discharge pipe 28. The lower hatch 25 is further fitted with a vacuum gauge 29 to measure the degree of vacuum occurring in the etching chamber 26.

A second circular depression 31 is concentrically formed in the central part of the inner flat bottom plane of the first depression 11 of the support table 10. A disk-like rest 32 is loosely inserted into said second circular depression 31. The central part of the underside of the disk-like rest 32 is connected to the upper end of a rotatable shaft 33 concentrically penetrating the central part of the bottom wall of the second circular depression 31 of said support table 10 and rotatably supported by the support table 10 through bearings (not shown). A palette-supporting rotatable disk 34 is concentrically mounted on the upper surface of the rest 32. The palette-supporting rotatable disk 34 has an outer diameter slightly smaller than the inner diameter of the depression 11 almost fully to occupy said depression 11 and is so disposed therein as to effect a horizontal rotation. The rotatable disk 34 has a plurality of (four in this embodiment) circular openings 35 equidistantly arranged along the periphery. Each circular opening 35 has a slightly smaller diameter than the hatches 14, 15 and is positioned concentric with them when brought right below them. A stepped portion 36 is formed along the periphery of the circular opening 35, enabling the later described palette 38 to be so supported as to securely cover the whole of the opening 35. A large number of through holes 37 are bored around each circular opening 35 of the circular disk 34. The palette 38 mounted on each opening 35 assumes a circular shape as shown in FIG. 3. A large number of small through holes 38a are formed around those portions of said palette 38, on each of which a semiconductor wafer 39 is placed. These small through holes 38a and small through holes 37 bored in the support disk 34 define a gas passage extending between the upper and lower surfaces of said support disk 34. A cylindrical gas flow-baffling skirt 40 is fitted along the entire inner peripheral wall of the etching chamber 26 defined by the second and third hatches 15, 25 with the lower edge of said skirt 40 disposed a little above the upper surface of the rotatable disk 34. As seen from FIG. 2, the gas flow-baffling skirt 40 is spaced from the small through holes 37 of the rotatable disk 34. This arrangement prevents a gas introduced into the etching chamber 26 through the gas feeder 21 and activated by charged particles from being conducted through a gap between the rotatable disk 34 and disk-like cover 12 to any other palette 38 than that which is received in the etching chamber 26. For reliable baffling of a gas flow, a distance between the lower edge of the gas flow-baffling skirt 40 and rotatable disk 34 is preferred to be 0.5 mm to 1.0 mm. Obviously, for effective baffling of a gas flow, a distance between the upper surface of the support table 10 on one hand and the rest 32 and the underside of the rotatable disk 34 on the other and a distance between the upper surface of the rotatable disk 34 and the underside of the disk-like cover 12 should preferably be as narrow as possible.

Constituent members of the subject etching apparatus, for example, support table 10, disk-like cover 12, hatches 15, 25, rotatable disk 34 and cylindrical gas flow-baffling skirt 40 are desired to be formed of a material such as stainless steel, or aluminum which is little likely to be corroded by an etching gas and admits of high precision work.

There will now be described the operation of an etching apparatus embodying this invention constructed as described above. First, the hatch 14 of the chamber in which an object of etching is to be received is opened to place, for example, a semiconductor wafer 39 on a palette 38 mounted on each of a plurality of (four in this embodiment as shown in FIG. 3) openings 35. The rotatable disk 34 is rotated by means of the rotatable shaft 33 manually or by proper drive means, for example, a step motor, until a palette mounted on a given opening 35 is brought into a chamber in which the semiconductor wafer 39 is received, thereby placing said wafer 39 on the palette 38. The above-mentioned operation is repeated to put the semiconductor wafers 39 on all or more than half of the palettes. Under this condition, etching of the semiconductor wafer 39 is commenced. Prior to said etching, the etching chamber 26 is evacuated to a prescribed degree of, for example, $10^{-5}$ to $10^{-4}$ torr. Thereafter, the plasma generator 22 is operated to activate Freon gas and oxygen gas. An activated mixture of Freon gas and oxygen gas is conducted through the gas feeder 21 into the etching chamber 26 from above. The activated gas mixture is drawn off by the vacuum pump 27 from below the etching chamber 26 through the gas discharge pipe 28. The semiconductor wafers 39 placed on the palette 38 are etched by the above-mentioned activated gas mixture flowing substantially vertically from the feeder 21 to the gas discharge pipe 28. To effect the vertical flow of the activated gas mixture, the palette 38 is bored with a large number of small through holes 38a, and the rotatable table 34 is also bored with a large number of small through holes 37. Further, as previously mentioned, the gas flow-baffling skirt 40 is provided to prevent the activated gas mixture from being diverted from the proper flowing course. Unlke the prior art etching by high electric and magnetic fields themselves, etching, by, for example, the above-mentioned activated gas mixture of this invention which has been drawn off from high electric and magnetic fields does not subject the semiconductor wafer to any excess etching, nor is carried out irregularly. Further, observation by an operator of the condition in which etching of an object is proceeding through the peep window 23 does not harmfully affect his eyes.

With the etching apparatus of the above-mentioned embodiment, a chamber in which an object of etching is to be placed is not fully shut off from the etching chamber 26. Where, therefore, the operator puts a fresh object in said object-receiving chamber while the preceding object is being etched in the etching chamber 26, he is sometimes subject to the harmful chemical effect of the activated gas mixture. Consequently, there continuous etching is to be effected by loading a plurality of objects in succession while the preceding object is being etched, it is necessary further to provide accessory equipment shown in FIGS. 4 and 5.

Figure 4:
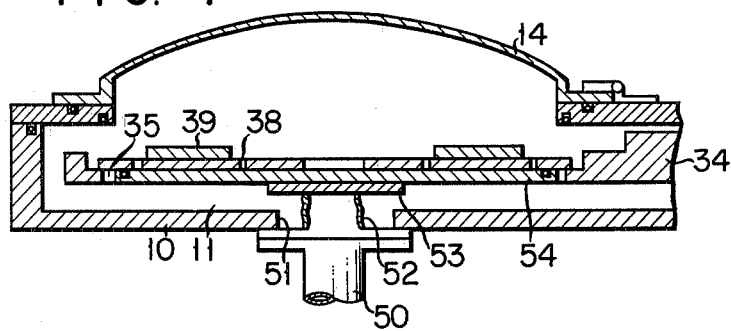
FIGS. 4 and 5 are fractional sectional views of a modification of the etching apparatus of the invention showing different operating conditions.
Figure 5:
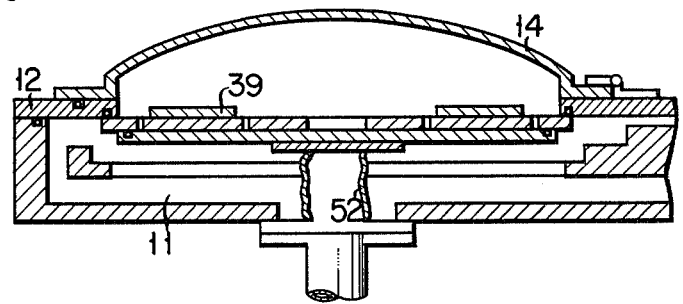
Figure 6:
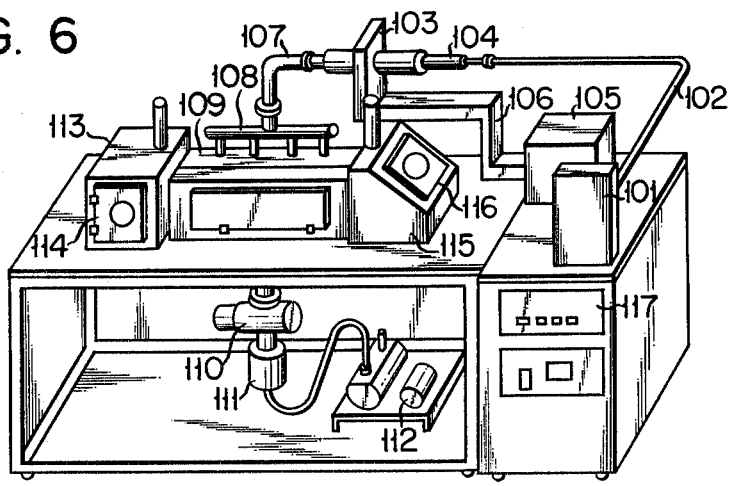
FIG. 6 is a perspective view of an etching apparatus according to another embodiment of this invention.

Referring to FIG. 4, referential numeral 50 is a pipe connected to a compressor (not shown). The inner end of the pipe 50 is connected to bellows 52 inserted into the depression 11 from the opening 51 of the support table 10. The upper end of the bellows 52 is hermetically closed by an end plate 53. The upper surface of the end plate 53 is fitted to be underside of a palette-supporting disk 54. This palette-supporting disk 54 has an outer diameter slightly smaller than the inner diameter of the opening 35 of the rotatable disk 34. While the etching apparatus is out of operation, the palette-supporting disk 54 is placed in the opening 35 of the rotatable disk 34. Where an object of etching 39 is loaded in an etching apparatus according to the embodiment of FIG. 4, constructed as described above, compressed air is carried into the bellows 52 from the compressor (not shown), thereby vertically lifting the palette-supporting disk 54 as shown in FIG. 5 and pressing the upper peripheral edge of the palette 38 against the underside of the disk-like cover 12 and consequence hermetically sealing the interior of the hatch section 14 relative to the depression 11 of the support table 10. Where the above-mentioned condition is attained, the hatch 14 is opened to put an object of etching 39 on the palette 38. After the hatch 14 is closed, the interior of the etching apparatus is brought back to the condition shown in FIG. 4. Thereafter, the support disk 34 is rotated, as in the etching apparatus of FIGS. 1 and 2, to carry out the succeeding steps of operation.

The etching apparatus of the foregoing embodiment used a mixture of tetrafluoromethane ($CF_4$) commercially known as Freon gas and oxygen gas activated by charged particles as an etching agent. However, this invention is not limited to this type of plasma. Further, an object of etching may be placed on the rotatable support table 10 directly without using the palette 38 or by any other means. Where the palette 38 is used, it is not always necessary to provide a stepped portion in the periphery of the respective openings 35 of the rotatable support table 10. Further, said opening 35 need not be limited to a circular form.

A reaction gas containing $CF_4$ gas and $O_2$ gas is introduced from a reaction gas feed chamber 101 to a quartz tube 104 at an activation portion 103 through a conduit 102. Plasma discharge is effected by means of a microwave power applied to the activation portion 103, thereby activating the reaction gas. The reaction gas feed chamber 101 is coupled to $CF_4$ gas, $O_2$ gas, and $N_2$ gas boms, while the microwave is produced at a microwave oscillator 105 and applied to the activation portion 103 by means of a wave guide 106.

The activated gas, activated at the activation portion 103, is introduced into a reaction chamber 109 through an activated gas conduit 107 and a manifold pipe 108 forming a distributor. By means of the activated gas are etched workpieces, such as semiconductor wafers, in a reaction chamber or etching chamber 109. Then the gas inside the reaction chamber 109 is discharged by using a mechanical booster pump 110 and a rotary pump 112. Between the mechanical booster pump 110 and rotary pump 112 is disposed an oil trap 111.

The workpieces or semiconductor wafers to be treated are first set into a feeding chamber 113 and then fed into the reaction chamber 109. The setting of the wafers into the feeding chamber 113 may be achieved by opening a carrier hatch 114 and introducing into the feeding chamber 113 a carrier loaded with a number of wafers. The wafers treated in the reaction chamber 109 are delivered to a carrier in a receiving chamber 115, and the carrier is taken out from a carrier hatch 116.

The above operations are automatically controlled by a control unit 117. The gas-contact region at the activation portion 103 is formed of quartz so as to transmit the microwave. The parts in contact with the activated gas, including activated gas conduit 107, manifold pipe 108, nozzle pipe 127, and reaction chamber 109, should preferably be formed of fluoride such as Teflon or coated so as to avoid corrosion by the activated gas.

Figure 7:
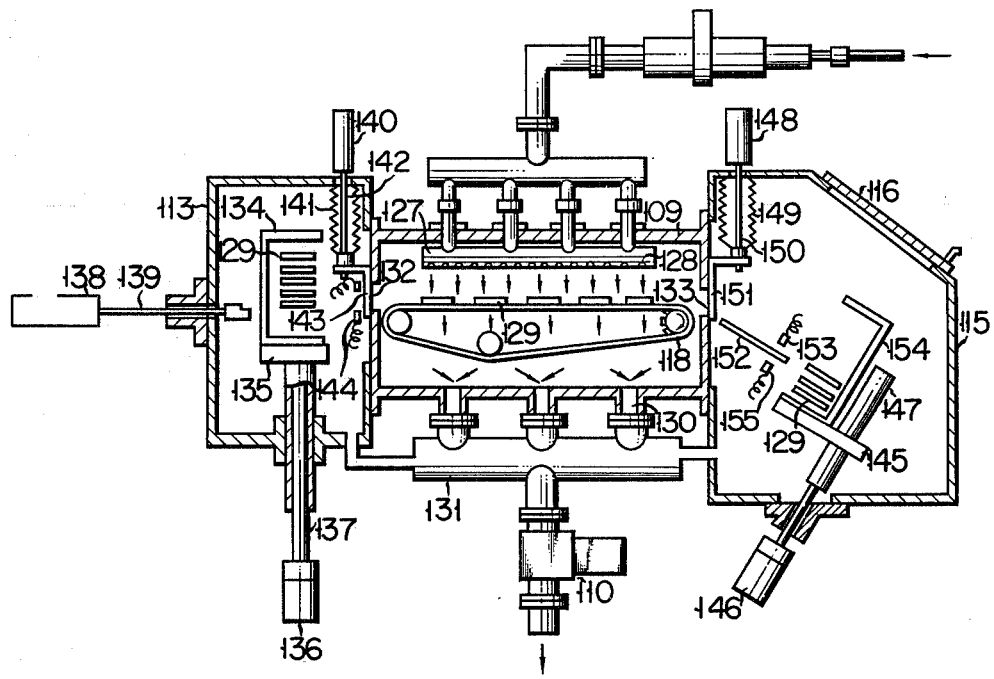
FIG. 7 is a sectional view of the part of the apparatus of FIG. 6.
Figure 8:
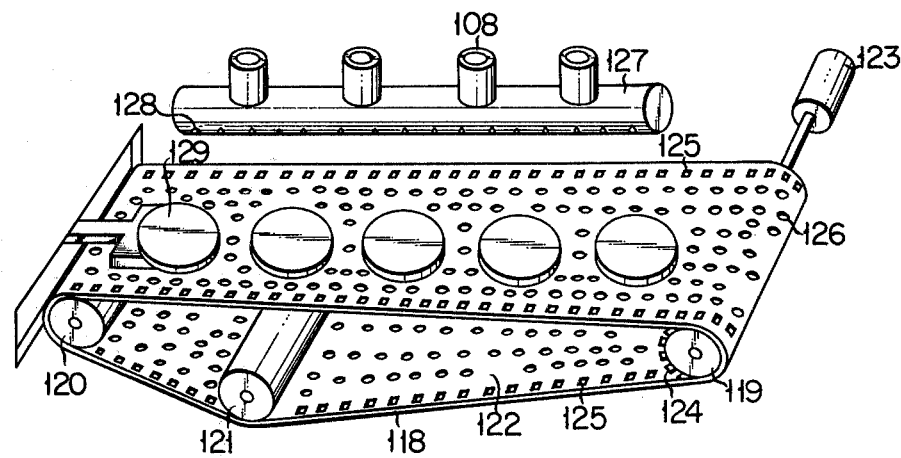
FIG. 8 is a perspective view showing a conveyer and nozzle pipe of the apparatus of FIG. 6.

Referring now to FIG. 7, the reaction chamber 109 is provided with a supporting member or a built-in conveyer 118 running from the vicinity of a wafer inlet 132 to the vicinity of an outlet 133. The mechanism of this conveyer 118 is shown in detail in FIG. 8. Turning now to FIG. 8, an endless belt 122 is passed round a sprocket 119 and pulleys 120 and 121. Teeth 124 of the sprocket 119 are engaged with perforations 125 of the belt 122, and the sprocket 119 rotates as a motor 123 is operated, thereby running the belt 122. The belt 122 is provided with pores 126 over its entire surface for facilitating the vertical passing of the activated gas.

Above the conveyer 118 in the reaction chamber 109 is disposed substantially in parallel with the conveyer 118 the nozzle pipe 127, which is provided with a plurality of nozzle holes 128 to face the wafers 129 carried by the conveyer 118. At the bottom portion of the reaction chamber 109 are arranged along the lower portion of the conveyer 118 a plurality of gas outlets 130, which are connected to an exhaust gas system by means of an exhaust manifold 131. The exhaust manifold 131 is also connected with the feeding chamber 113 and receiving chamber 115.

The reaction chamber 109 is connected with the feeding chamber 113 by means of the wafer inlet 132 and with the receiving chamber 115 by means of the wafer outlet 133. In the feeding chamber 113 a carrier 134 containing a number of wafers 129 is placed on a carrier mount 135 which is moved up and down by means of a feed screw 137 rotated by a motor 136. Further, the feeding chamber 113 is fitted with a wafer pusher 139 reciprocated by an air cylinder 138, and the wafers 129 in the carrier 134 are fed into the reaction chamber 109 by means of the wafer pusher 139. In addition, the feeding chamber 113 is provided with a shutter 143 reciprocated by an air cylinder 140. The shutter 143 is coupled to the air cylinder 140 by means of a rod 142 surrounded by a bellows 141. The shutter 143 may not completely close up the wafer inlet 132 but allow a clearance of some 1 mm width. The internal side wall of the carrier 134 is provided with grooves at regular pitches, in which the respective wafers 129 are held. Through the back side of the carrier 134 are bored holes for the respective wafers contained through which the wafer pusher 139 is to be introduced, and the wafers are fed on to the conveyor 118 inside the reaction chamber 109 through the inlet 132. The wafers are successively fed on to the conveyer 118 by means of the vertical movement of the carrier mount. In front of the inlet 132 is disposed a sensing device 144 with a light source and photosensor for detecting the feed of wafers.

In the receiving chamber 115, a carrier 154 to receive the wafers treated in the reaction chamber 109 is placed on a carrier mount 145, which is moved up and down by means of a feed screw 147 driven by a motor 146 in the same manner as the case of the carrier mount 135 in the feeding chamber 113. The carrier mount 145 is slantly attached. Like the feeding chamber 113, the receiving chamber 115 is also provided with a shutter 151 for opening and shutting the outlet 133. This shutter 151 is driven by an air cylinder 148 through a rod 150 surrounded by a bellows 149. Like the shutter 143, the shutter 151 may not completely close up the wafer outlet 133 but allow a clearance of some 1 mm width. In the vicinity of the outlet 133 is disposed an inclined guide rail 152 for introducing wafers 129 treated in the reaction chamber 109 into the carrier 154. The angle of inclination of the guide rail 152 should preferably be 30° from the level surface. The guide rail 152 is provided with e.g. a slit. On the upper and lower side of the slit a photosensor 153 and light source 155 for detecting the passage of the wafers 129.

Now we will describe the operation of the etching apparatus as described below.

First, the carrier 134 containing a plurality of untreated wafers 129 are set on to the carrier mount 135 by opening the hatch 114 of the feeding chamber 113, the empty carrier 154 is set on to the carrier mount 145 by opening the hatch 116 of the receiving chamber 115, and then the respective hatches 114 and 116 are closed. Then, by pushing a start switch of the control unit 117, all the processes for wafer etching treatment may be automatically conducted in the following sequence. That is, the rotary pump 112 and mechanical booster pump 110 are operated to adjust the pressures inside the reaction chamber 109, feeding chamber and receiving chamber to approximately $10^{-2}$ to $10^{-1}$ torr. Then the air cylinders 140 and 148 automatically operate to open the shutters 143 and 151. The shutters 143 and 151 are intended for preventing the activated gas from penetrating into the feeding chamber 113 and receiving chamber 115. When the shutters 143 and 151 are opened, the motor 136 automatically operates to shift the carrier 134 by means of the rotation of the feed screw 137, and stops when the carrier 134 has reached a prescribed position. Subsequently, the wafer pusher 139 operates to push out one of the wafers in the carrier 134 on to the conveyer. When the sensing device 144 detects the passage of the wafer 129 and the air pusher 139 is restored to its original position, the belt 122 of the conveyer 118 is forwarded to the receiving chamber 115 side through one pitch of feed for placing a wafer by means of the operation of the motor 123, and stops where it is. Thus, a prescribed number of wafers 129 are placed on to the conveyer 118 by repeating at a prescribed interval the process including the shifting of the carrier, pushing of the wafers 129 by means of the wafer pusher 139, and one-pitch feed of the belt 122. Thereupon, the shutters 143 and 151 are closed, and the reaction gas begins to flow from the reaction gas feed chamber 101 to the activation portion 103 through the conduit 102. The microwave oscillator 105 operates several seconds after the start of the reaction gas flow to apply a microwave to the activation portion 103 by means of the wave guide 106, thereby activating the reaction gas inside the activation portion 103. The activated gas is introduced into the reaction chamber 109 by means of the manifold 108 and nozzle pipe 127. The activated gas introduced into the reaction chamber 109 is discharged by means of the mechanical booster pump 110 and rotary pump 112 after etching the wafers 129 on the conveyor 118.

The time from the start to the end of the etching process is set by e.g. a timer, and the supply of the reaction gas and application of the microwave are stopped after such set time, thereby opening the shutters 143 and 151. Then the conveyer 118 moves through a pitch, and the etched wafer 129 slides over the guide rail 152 through the wafer outlet 133 to be received by the carrier 154. At the same time the wafers 129 are fed from the feeding chamber 113 on to the conveyer 118 by means of the pusher 139. When these operations have been repeated a prescribed number of times, the replacement of the treated wafers 129 with the untreated wafers 129 in the reaction chamber 109 is completed. In this replacing operation, there would naturally be achieved the lowering operation of the carriers 134 and 154, one-pitch feed of the conveyer 118, and detection of the wafer by means of the photosensers 144 and 153 with every wafer replaced.

When the replacement of wafers is completed and the shutters 143 and 151 are closed, the supply of the activated gas into the reaction chamber 109 is started, thereafter repeating the same operations. Thus, when the wafers 129 in the carrier 134 are all etched and received by the carrier 154, an $N_2$ gas flows and replaces the residual gas within the apparatus, and then the exhaust system is stopped, thereby providing atmospheric pressure in the apparatus and finishing the processes.

What we claim is:

1. An etching apparatus for etching an object using a plasma comprising an apparatus body including an etching chamber, a supporting member provided in the etching chamber to separate the etching chamber into an upper space and a lower space, the supporting member including an endless belt horizontally supporting the object thereon and a driving mechanism for driving the endless belt, communicating means including a plurality of separate and distinct through holes formed in the endless belt equally distributed around the object and communicating the upper space of the etching chamber to the lower space thereof, a plasma generator located entirely outside of the etching chamber and activating an introduced gas thereby causing the activated gas to have an etching action, a gas supplying tube connected to the upper space of the etching chamber to feed the activated gas therein, said gas supplying tube having a manifold at its end located in the upper space of the etching chamber and extending along the advancing direction of the belt, and an exhaust tube connected to the lower space of the etching chamber to exhaust the activated gas through the through holes in the belt and the lower space of the etching chamber.

2. The etching apparatus according to claim 1, which further includes a feeding chamber provided at the inlet end of the etching chamber and a receiving chamber provided at the discharge end of the etching chamber, said endless belt operable to linearly transfer the objects from the feeding chamber to the receiving chamber.

3. An etching apparatus for etching an object using a plasma comprising an apparatus body including an etching chamber, a supporting member provided in the etching chamber to separate the etching chamber into an upper space and a lower space, the supporting member horizontally supporting the object thereon, communicating means including a plurality of separate and distinct through holes formed in the supporting member equally distributed around the object and communicating the upper space of the etching chamber to the lower space thereof, a plasma generator located entirely outside of the etching chamber and activating an introduced gas thereby causing the activated gas to have an etching action, a gas supplying tube connected to the upper space of the etching chamber to feed the activated gas therein, and an exhaust tube connected to the lower space of the etching chamber to exhaust the activated gas through the through holes in the supporting member and the lower space of the etching chamber, a feeding chamber inlet at the inlet end of the etching chamber, a carrier in said feeding chamber and containing a plurality of objects, and a pusher in said feeding chamber and adapted to selectively engage objects on said carrier and position them on said supporting member.

4. The etching apparatus according to claim 3, including an inlet opening in said etching chamber between said carrier and said supporting member, and means for closing said inlet opening and operable to open said inlet opening to allow delivery of said objects to said etching chamber.

5. An etching apparatus for etching an object using a plasma comprising an apparatus body including an etching chamber, a supporting member provided in an etching chamber to separate the etching chamber into an upper space and a lower space, the supporting member horizontally supporting the object thereon, communicating means including a plurality of separate and distinct through holes formed in the supporting member equally distributed around the object and communicating the upper space of the etching chamber to the lower space thereof, a plasma generator located entirely outside of the etching chamber and activating an introduced gas thereby causing the activated gas to have an etching action, a gas supplying tube connected to the upper space of the etching chamber to feed the activated gas therein, an exhaust tube connected to the lower space of the etching chamber to exhaust the activated gas through the through holes in the supporting member and the lower space of the etching chamber, a receiving chamber at the discharge end of the etching chamber, a carrier in said receiving chamber receiving etched objects from said etching chamber, said receiving carrier including means responsive to delivery of said etched objects to facilitate stacking of said etched objects.

6. The etching apparatus according to claim 5, including a discharge opening in said etching chamber between said supporting member and said carrier, means for closing said discharge opening and operable to open said discharge opening to allow delivery of said objects from the etching chamber to said carrier.

* * * * *